US007739088B2

(12) United States Patent
Shen (10) Patent No.: US 7,739,088 B2
(45) Date of Patent: Jun. 15, 2010

(54) METHOD AND PROGRAM FOR SIMULATING OCCURRENCE OF AIR POCKET

(75) Inventor: Jianrong Shen, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 1013 days.

(21) Appl. No.: 11/480,842

(22) Filed: Jul. 6, 2006

(65) Prior Publication Data

US 2007/0010976 A1      Jan. 11, 2007

(30) Foreign Application Priority Data

Jul. 7, 2005    (JP)   ............... 2005-198709

(51) Int. Cl.
    *G06G 7/50* (2006.01)
(52) U.S. Cl. ........................................... 703/9
(58) Field of Classification Search ................ 703/9
    See application file for complete search history.

(56) References Cited

U.S. PATENT DOCUMENTS

2003/0042135 A1 * 3/2003 Katsumaru et al. ....... 204/229.8
2005/0114097 A1 * 5/2005 Duncan ......................... 703/1

FOREIGN PATENT DOCUMENTS

EP          1 134 031         3/2001
JP         10-45037           2/1998
JP         2000-057200        2/2000
JP         2006-116385    *   5/2006
WO     WO 2005/022468        3/2005

OTHER PUBLICATIONS

Prasad Dev Hanumalagutti et al., "Prediction of e-coat voids and puddles during automotive painting using ANSA", Jun. 14, 2007, 2nd Annual ANSA and μeta International Congress, pp. 259-266.*
Stefan Gotthold, "VPS/DIP—Product Presentation", 2007, CADFEM, pp. 1-17.*
T. Komoriya et al., Abstract of "Development on Prediction Method of Air Pocket in Electro Deposition Process", 2006, internet site http://sciencelinks.jp/j-east/article/200622/000020062206A0846451.php; one unnumbered page.*

(Continued)

*Primary Examiner*—Paul L Rodriguez
*Assistant Examiner*—Russ Guill
(74) *Attorney, Agent, or Firm*—McGinn IP Law Group, PLLC (57) ABSTRACT

A method simulating an occurrence of an air pocket in an object to be coated is provided with steps of: setting an initial boundary element; setting an element having a common nodal point with the initial boundary element as a flanking element; analyzing the flanking element; setting the analyzed flanking element as a secondary boundary element; setting an element having a common nodal point with the secondary boundary element as a flanking element; analyzing the flanking element; and determining whether there is a remaining flanking element. When there is a remaining flanking element, a secondary boundary setting step and a second analysis step are repeatedly performed, until no remaining flanking element is determined.

16 Claims, 8 Drawing Sheets

OTHER PUBLICATIONS

Shunliang Jiang et al., "Optimum arrangement of gate and vent locations for RTM process design using a mesh distance-based approach", 2002, Composites: Part A, vol. 33, pp. 471-481.*

European Search Report dated Dec. 19, 2006.

Piegl et al. "Geometry-based triangulation of trimmed NURBS surfaces", Computer-Aided Design, vol. 30, No. 1, 1998, pp. 11-18.

* cited by examiner

METHOD AND PROGRAM FOR SIMULATING OCCURRENCE OF AIR POCKET

The present application claims foreign priority based on Japanese Patent Application No. P.2005-198709, filed on Jul. 7, 2005, the contents of which are incorporated herein by reference.

BACKGROUND OF THE INVENTION

1. Field of the Invention

The present invention relates to a method of simulating an occurrence of an air pocket in an object to be immersed in a coating material tank and a program executable by a computer for executing the method. More particularly, the present invention relates to a method and a program for simulating the occurrence of the air pocket in the object by dividing a shape data of the object into two-dimensional elements to thereby perform analysis thereon.

2. Related Art

Coating methods, for example, a plating method of immersing an object to be coated, such as a semiconductor or a vehicle body of an automobile, in a coating material tank filled with molten metal to thereby coat the object, and an electrodeposition coating method of immersing an object to be coated in a coating material tank filled with electrodeposition liquid to thereby coat the object, have advantages in that a coating film is substantially uniform in thickness, and that also, a weld part of the object can be coated. On the other hand, such coating methods have a drawback in that in a case where an air pocket occurs in a concave portion provided in a complicatedly shaped component or in a depressed portion of the inner surface of a hood or a roof, or the bottom surface of a floor of an automobile, no coating area can be formed in this portion.

Accordingly, the shape of the object to be coated is appropriately designed to prevent an occurrence of the air pocket. Then, the object is immersed (see, for example, JP-A-10-045037).

Meanwhile, it can preliminarily be determined by a known analysis method, which utilizes a free surface, whether an air pocket occurs in the object. However, analysis has hitherto been performed by dividing a shape data of an analysis object into three-dimensional elements. Thus, in a case where the object is complex in shape like a vehicle body, the analysis is complex. Consequently, it has been time-consuming to simulate a place at which an air pocket occurs.

A problem to be solved by the invention is to efficiently simulate an occurrence of an air pocket, which is formed in an object to be coated when the object is immersed in a liquid coating material to coat the object therewith, by simplifying analysis.

SUMMARY OF THE INVENTION

In accordance with one or more embodiments of the present invention, as a first aspect of the invention, a method of simulating an occurrence of an air pocket in an object to be coated, is provided with:

a first step of dividing a shape data of the object to be immersed in a coating material tank into a plurality of two-dimensional elements;

a second step of setting an element locating at an end portion or a hole portion of the object as an initial boundary element, and setting an element having a common nodal point with the initial boundary element as a flanking element;

a third step of analyzing the flanking element set in the second step based on the initial boundary element;

a fourth step of setting the flanking element analyzed in the third step as a secondary boundary element, and also setting an element having a common nodal point with the secondary boundary element as a flanking element;

a fifth step of analyzing the flanking element set in the fourth step based on the secondary boundary element; and a sixth step of determining whether there is any flanking element adjoining the secondary boundary element, and of repeatedly performing, when it is determined that there is flanking element adjoining the secondary boundary element, the fourth step and the fifth step in the order until it is determined that there is no flanking element adjoining the secondary boundary element, and of finishing analysis when it is determined that there is no flanking element adjoining the secondary boundary element.

Further, in accordance with one or more embodiments of the present invention, as a second aspect of the invention, in the third step, a height of a center of gravity of the flanking element is compared with a height of a center of gravity of the initial boundary element, when the center of gravity of the initial boundary element is higher than the center of gravity of the flanking element, it is determined that the flanking element is filled with liquid coating material, and when the center of gravity of the initial boundary element is lower than the center of gravity of the flanking element, it is determined that the flanking element is filled with air; and in the fifth step, a height of a center of gravity of the flanking element is compared with a height of a center of gravity of the secondary boundary element, when the center of gravity of the secondary boundary element is higher than the center of gravity of the flanking element, it is determined that the flanking element is filled with liquid coating material, and when the center of gravity of the secondary boundary element is lower than the center of gravity of the flanking element, it is determined that the flanking element is filled with air.

Further, in accordance with one or more embodiments of the present invention, as a third aspect of the invention, in the third step, a height of a highest nodal point of the flanking element is compared with a height of a highest nodal point of the initial boundary element, when the highest nodal point of the initial boundary element is higher than the highest nodal point of the flanking element, it is determined that the flanking element is filled with liquid coating material, and when the highest nodal point of the initial boundary element is lower than the highest nodal point of the flanking element, it is determined that the flanking element is filled with air; and in the fifth step, a height of a highest nodal point of the flanking element is compared with a height of a highest nodal point of the secondary boundary element, when the highest nodal point of the secondary boundary element is higher than the highest nodal point of the flanking element, it is determined that the flanking element is filled with liquid coating material, and when the highest nodal point of the secondary boundary element is lower than the highest nodal point of the flanking element, it is determined that the flanking element is filled with air.

Further, in accordance with one or more embodiments of the invention, as a fourth aspect of the invention, the object is a vehicle body.

In addition, in accordance with one or more embodiments of the present invention, as a fifth aspect of the invention, a program executable by a computer for simulating an occurrence of an air pocket in an object to be coated, is provided with:

a first step of dividing a shape data of the object to be immersed in a coating material tank into a plurality of two-dimensional elements;

a second step of setting an element locating at an end portion or a hole portion of the object as an initial boundary element, and setting an element having a common nodal point with the initial boundary element as a flanking element;

a third step of analyzing the flanking element set in the second step based on the initial boundary element;

a fourth step of setting the flanking element analyzed in the third step as a secondary boundary element, and also setting an element having a common nodal point with the secondary boundary element as a flanking element;

a fifth step of analyzing the flanking element set in the fourth step based on the secondary boundary element; and a sixth step of determining whether there is any flanking element adjoining the secondary boundary element, and of repeatedly performing, when it is determined that there is flanking element adjoining the secondary boundary element, the fourth step and the fifth step in the order until it is determined that there is no flanking element adjoining the secondary boundary element, and of finishing analysis when it is determined that there is no flanking element adjoining the secondary boundary element.

Further, in accordance with one or more embodiments of the present invention, as a sixth aspect of the invention, in the third step, a height of a center of gravity of the flanking element is compared with a height of a center of gravity of the initial boundary element, when the center of gravity of the initial boundary element is higher than the center of gravity of the flanking element, it is determined that the flanking element is filled with liquid coating material, and when the center of gravity of the initial boundary element is lower than the center of gravity of the flanking element, it is determined that the flanking element is filled with air; and in the fifth step, a height of a center of gravity of the flanking element is compared with a height of a center of gravity of the secondary boundary element, when the center of gravity of the secondary boundary element is higher than the center of gravity of the flanking element, it is determined that the flanking element is filled with liquid coating material, and when the center of gravity of the secondary boundary element is lower than the center of gravity of the flanking element, it is determined that the flanking element is filled with air.

Further, in accordance with one or more embodiments of the present invention, as a seventh aspect of the invention, in the third step, a height of a highest nodal point of the flanking element is compared with a height of a highest nodal point of the initial boundary element, when the highest nodal point of the initial boundary element is higher than the highest nodal point of the flanking element, it is determined that the flanking element is filled with liquid coating material, and when the highest nodal point of the initial boundary element is lower than the highest nodal point of the flanking element, it is determined that the flanking element is filled with air; and in the fifth step, a height of a highest nodal point of the flanking element is compared with a height of a highest nodal point of the secondary boundary element, when the highest nodal point of the secondary boundary element is higher than the highest nodal point of the flanking element, it is determined that the flanking-element is filled with liquid coating material, and when the highest nodal point of the secondary boundary element is lower than the highest nodal point of the flanking element, it is determined that the flanking element is filled with air.

Further, in accordance with one or more embodiments of the present invention, as a eighth aspect of the invention, the object is a vehicle body.

According to the first and fifth aspects, an analysis is performed by decomposing an analysis object into a plurality of two-dimensional elements. Thus, according to the method and program, an analysis process is simplified, as compared with the related method of performing analysis by decomposing the analysis object into a plurality of three-dimensional elements. Also, an analysis time is reduced, as compared with the related method.

In addition, according to the first and fifth aspects, the analysis is performed by dividing the object into two-dimensional elements. Thus, a computation time from an initial state to a converged state can significantly be reduced, as compared with the case of dividing the object into three-dimensional elements. Thus, even when the object is not actually immersed in the coating material tank, the position of an air pocket can quickly be simulated by numerical calculation.

Also, according to the first and fifth aspects, in a case where a result of the calculation reveals that an air pocket occurs, analysis is performed again by changing the finite element model to a model obtained by performing boring or shape change on the object. Thus, the shape of the object, in which no air pocket occurs, is simulated. Also, this can quickly be fed back to the design of the object. Consequently, the cost and the time required to develop a object to be coated can be reduced.

Also, according to the first and fifth aspects, the analysis is performed by dividing the analysis object into two-dimensional elements. The analysis process can be simplified, as compared with the case of dividing the object into three-dimensional elements. The analysis of an air pocket, which occurs in the object when immersed, can efficiently be achieved. Also, it can easily and rapidly be determined whether an air pocket occurs.

Also, according to the first and fifth aspects, a state, in which an air pocket is formed in the object put in the coating material tank, can be seen in a simulated way.

Further, according to the second and sixth aspects, the analysis of the flanking elements can quickly be performed by comparing the heights of the centers of gravity of the two-dimensional elements having nodal points in common with each other. Thus, it can accurately and easily be determined whether an air pocket occurs in the object.

Further, according to the third and seventh aspects, the analysis of the flanking elements can quickly be performed by comparing the heights of the highest nodal points of the two-dimensional elements having nodal points in common with each other. Thus, it can accurately and easily be determined whether an air pocket occurs in the object.

Further, according to the fourth and eighth aspects, an amount of liquid coating material, which is used when a vehicle body is immersed in the coating material tank and is coated therewith, can easily and accurately be calculated.

Other aspects and advantages of the invention will be apparent from the following description and the appended claims.

DETAILED DESCRIPTION OF THE EXEMPLARY EMBODIMENTS

Exemplary embodiments of the invention will be described with reference to the accompanying drawings. However, the scope of the invention is not limited to an illustrated example. Incidentally, the following description describes a case, in which electrodeposition coating is performed on a vehicle body, by way of example. A coating method, to which the invention can be applied, is not limited to the electrodeposition coating method. The invention can be applied to any other coating method, as long as the coating method is adapted to coat the object by immersing the object in the liquid coating material.

First Exemplary Embodiment

Figure 1:
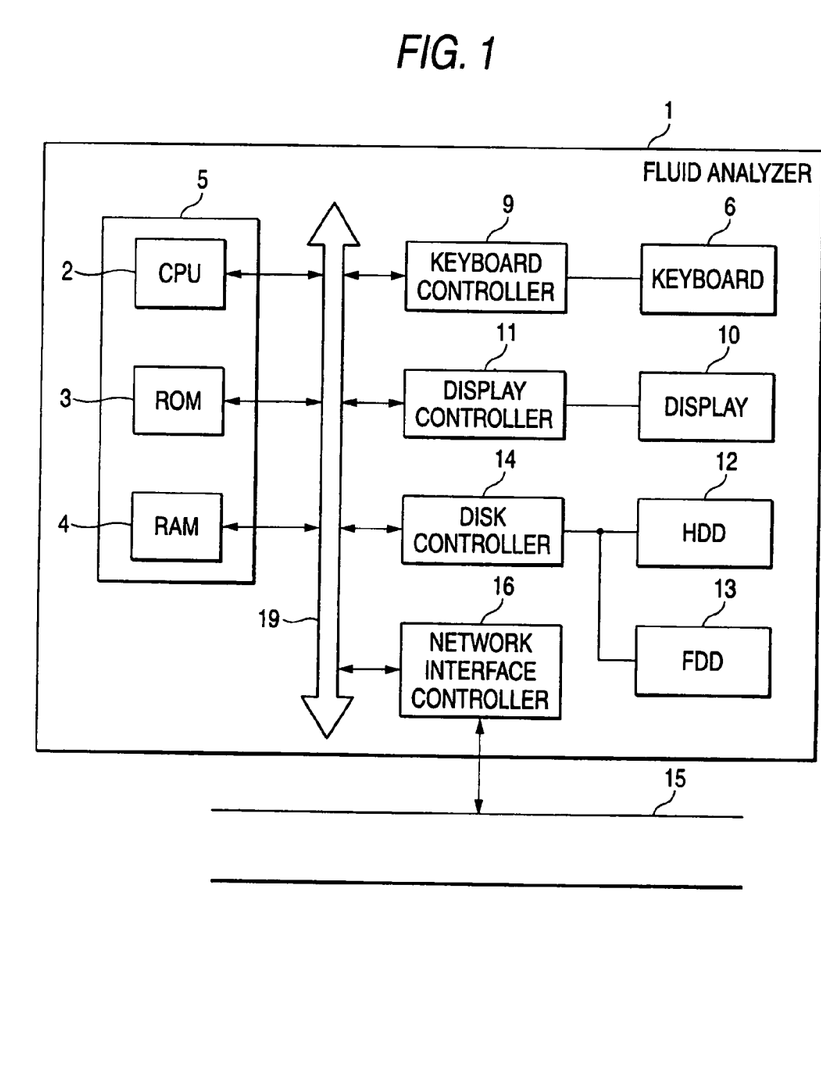
FIG. 1 is a schematic block diagram illustrating the configuration of a fluid analyzer.

FIG. 1 is a block diagram illustrating the configuration of an example of a fluid analyzer 1 used to perform the method of simulating an occurrence of an air pocket in an object to be coated according to the first exemplary embodiment.

As shown in FIG. 1, the fluid analyzer 1 according to the exemplary embodiment is provided with a control portion 5, which has a CPU 2, a ROM 3, and a RAM 4, a keyboard controller 9 for a keyboard 6, a display controller 11 for a display unit 10 serving as a display portion, a disk controller 14 for a hard disk drive (HDD) 12 and a flexible disk drive (FDD) 13, and a network interface controller 16 for connection to a network 15, which are communicatably connected to one another through a system bus 19.

The CPU 2 is configured to comprehensively control the constituent portions connected to the system bus 19 by performing software stored in the hard disk drive 12 or software provided from the flexible disk drive 13. That is, the CPU 2 reads processing programs from the ROM 3, the hard disk drive 12, or the flexible disk drive 13 according to a predetermined processing sequence and performs the read processing programs to thereby control an operation of performing a method of simulating an occurrence of an air pocket in a object to be coated according to the first exemplary embodiment. Further, the program maybe read via a communication means from an external storage located in other device than the fluid analyzer 1.

The CPU 2 reads from the hard disk drive 12 a shape data representing a member to be analyzed. Then, the CPU 2 divides surfaces of the member into a plurality of elements and constructs a two-dimensional numerical calculation model for numerical computation. Also, the CPU 2 is adapted to perform setting of an initial boundary element, a secondary boundary element, and flanking elements.

Also, the CPU 2 is adapted to analyze the flanking element by comparing the height of the initial boundary element with that of the flanking element. Further, the CPU 2 is adapted to set, upon completion of the comparison between the initial boundary element and the flanking element in height, the flanking element to be a secondary boundary element, and to subsequently determine whether there is any flanking element adjoining the secondary boundary element. Thus, the CPU 2 analyzes the flanking element.

The RAM 4 functions as a main memory or a work area for the CPU 2. The keyboard controller 9 controls the input of instructions from the keyboard 6 and a pointing device (not shown). The display controller 11 controls the indication of data in the display unit 10. The disk controller 14 controls accesses to the hard disk drive 12 and the flexible disk drive 13, which store a boot program, various application programs, edit files, user files, a network management program, and predetermined processing programs according to this embodiment. The network interface controller 16 is adapted to bi-directionally transmit and receive data to and from an apparatus or a system provided on the network 15.

Also, data representing a vehicle body to be analyzed is stored in the hard disk drive 12.

The method of simulating an occurrence of an air pocket in an object to be coated is configured to perform numerical analysis of electrodeposition liquid and a flow of air at the electrodeposition coating of the vehicle body. First, a vehicle body coating line is briefly described below by referring to FIG. 2.

Figure 2:
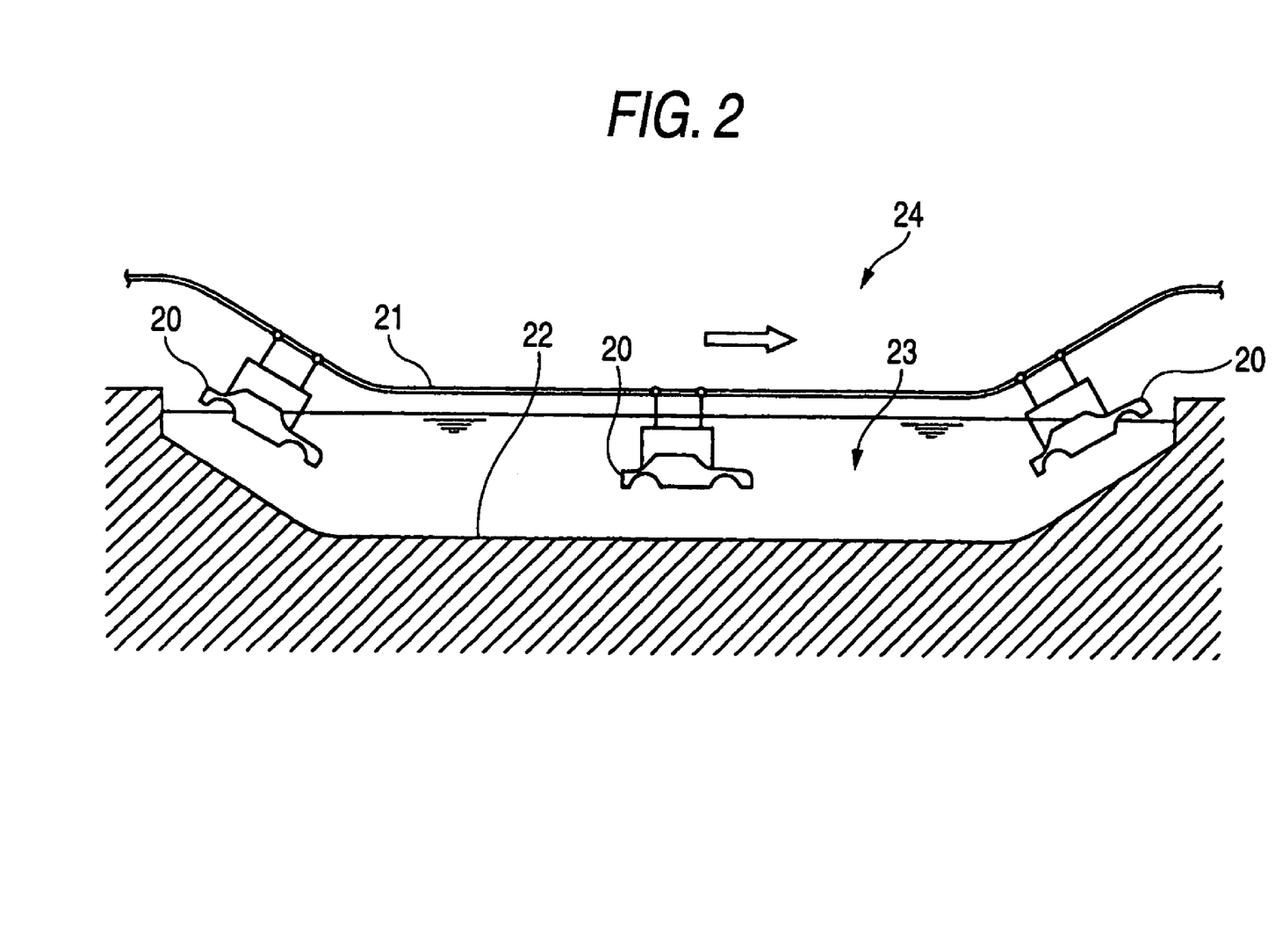
FIG. 2 is a schematically explanatory diagram illustrating a vehicle body coating line.

A vehicle body 20 is constructed by bonding a plurality of vehicle body panels through welding. As shown in FIG. 2, the vehicle bodies 20 are conveyed in a state, in which each of the vehicle bodies 20 is mounted on a hanger of a conveying apparatus 21, by the coating line in a substantially horizontal direction. Degreasing, water-washing, surface-conditioning, film transformation and water-washing are performed on the coating line as pretreatments for electrodeposition coating. Upon completion of such treatments, the vehicle body 20 serving as an automobile body downwardly goes toward an electrodeposition tank 22. Then, the vehicle body 20 is moved in a substantially horizontal direction while the vehicle body 20 is immersed in the electrodeposition liquid 23. In this state, a voltage is applied to each of the vehicle body 20 and an electrode (not shown) provided in the electrodeposition tank 22. Thus, the coating material is deposited on the vehicle body panel. Subsequently, the vehicle body 20 is upwardly drawn from the electrodeposition tank 22 by the conveying apparatus 21. Then, the electrodeposition liquid 23, which is not electrodeposited onto but adheres to the vehicle body panel, is removed by water-washing.

Figure 3:
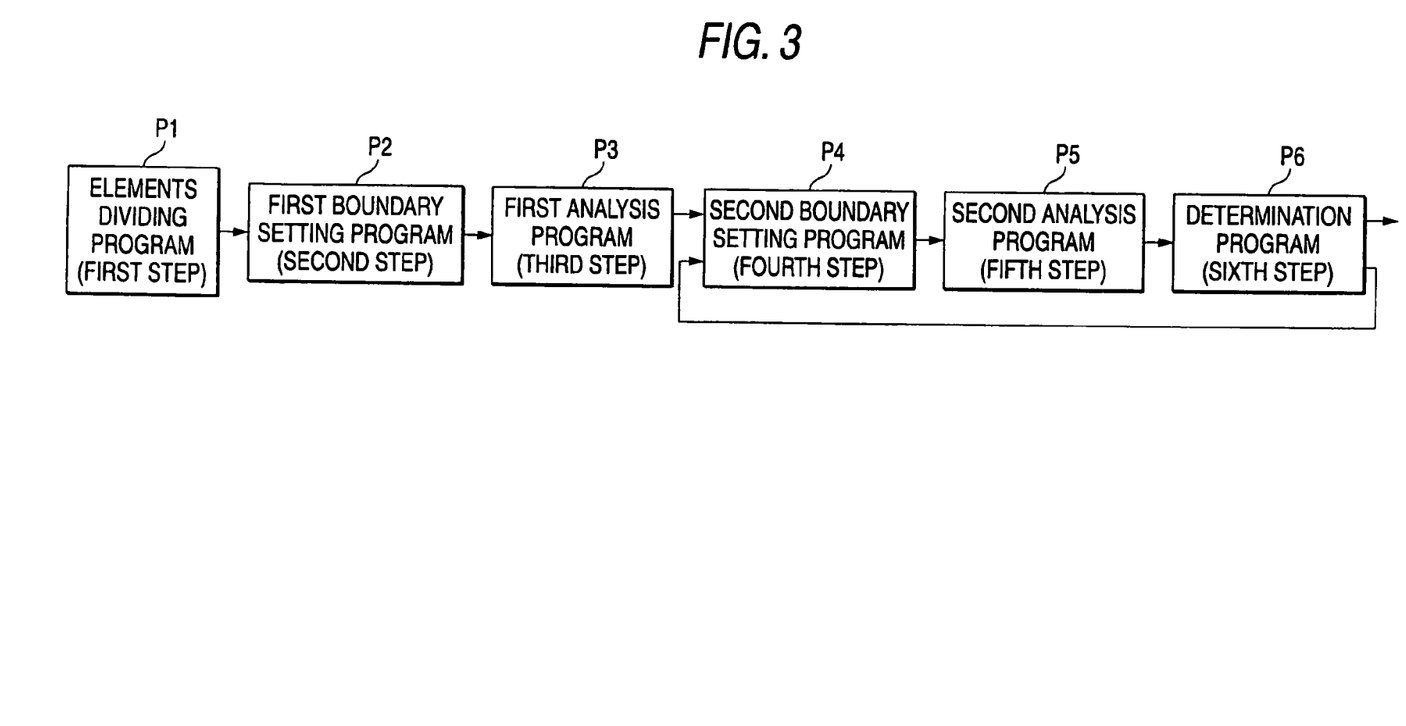
FIG. 3 is a explanatory diagram illustrating a program (programs P1 to P6).

A program executable by a computer for simulating an occurrence of an air pocket in an object to be coated is described with reference to FIG. 3. The program shown in FIG. 3 is a control program which is stored in the ROM 3 or HDD 12 of the fluid analyzer 1 or sent from an outside device via the network 15. The program is executed by the CPU 2. The program includes: an elements dividing program P1 for executing a first step; a first boundary setting program P2 for executing a second step; a first analysis program P3 for executing a third step; a secondary boundary setting program P4 for executing a fourth step; a second analysis program P5 for executing a fifth step; and a determination program P6 for executing a sixth step.

The elements dividing program (first step) P1 divides the shape data of the object to be immersed in the coating material tank into a plurality of two-dimensional elements. When the shape data is divided into the plurality of two-dimensional elements by the elements dividing program P1, the first boundary setting program (second step) P2 is executed. The first boundary setting program P2 sets an element locating at an end portion or a hole portion of the object as an initial boundary element, and sets an element having a common nodal point with the initial boundary element as a flanking element. The flanking elements sets by the first boundary setting program (second step) P2 is analyzed by the first analysis program (third step) P3 based on the initial boundary element.

After an analysis by the first analysis program (third step) P3, the secondary boundary setting program (fourth step) P4 is executed, so that the analyzed flanking element is set as a secondary boundary element, and an element having a common nodal point with the secondary boundary element is set as a flanking element. The flanking element set by the secondary boundary setting program (fourth step) P4 is analyzed by the second analysis program (fifth step) P5 based on the secondary boundary element.

Then, by the determination program (sixth step) P6, it is determined whether there is any flanking element adjoining the secondary boundary element. When it is determined that there is flanking element adjoining the secondary boundary element, the secondary boundary setting program (fourth step) P4 and the second analysis program (fifth step) P5 are repeatedly performed in the order of the secondary boundary setting program (fourth step) P4 and the second analysis program (fifth step) P5, until it is determined that there is no flanking element adjoining the secondary boundary element. When it is determined that there is no flanking element adjoining the secondary boundary element, the analysis is finished.

Hereinafter, a method of simulating an occurrence of an air pocket in an object to be coated according to the exemplary embodiment is described in detail by referring to a flowchart shown in FIG. 4. Incidentally, in the method described hereinbelow, a finite element method is employed. Also, among members of the vehicle body 20, analysis is performed on a floor panel 26 shown in FIG. 5 by way of example.

Figure 4:
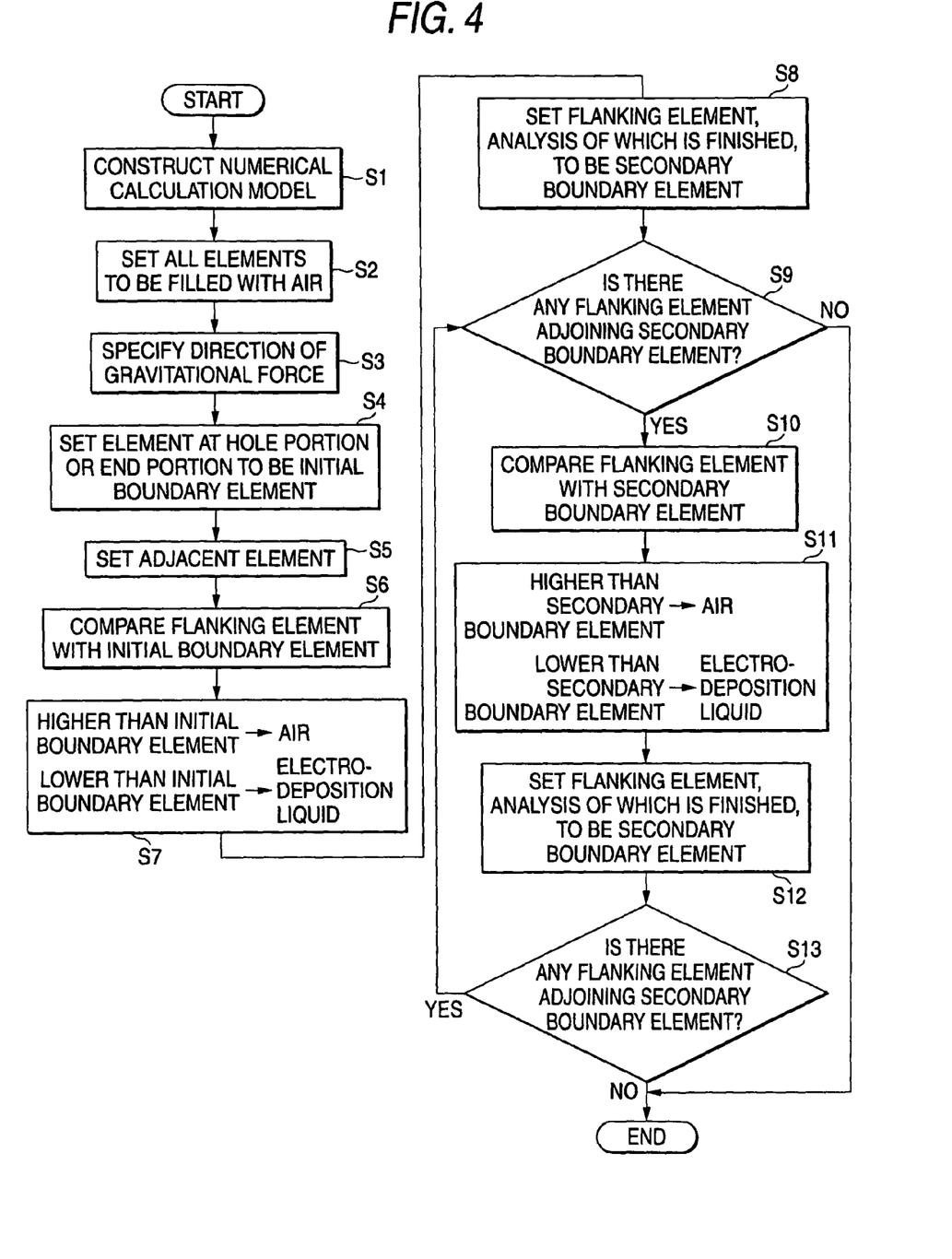
FIG. 4 is a flowchart illustrating a method of simulating an occurrence of an air pocket in a coating object according to a first exemplary embodiment.
Figure 5:
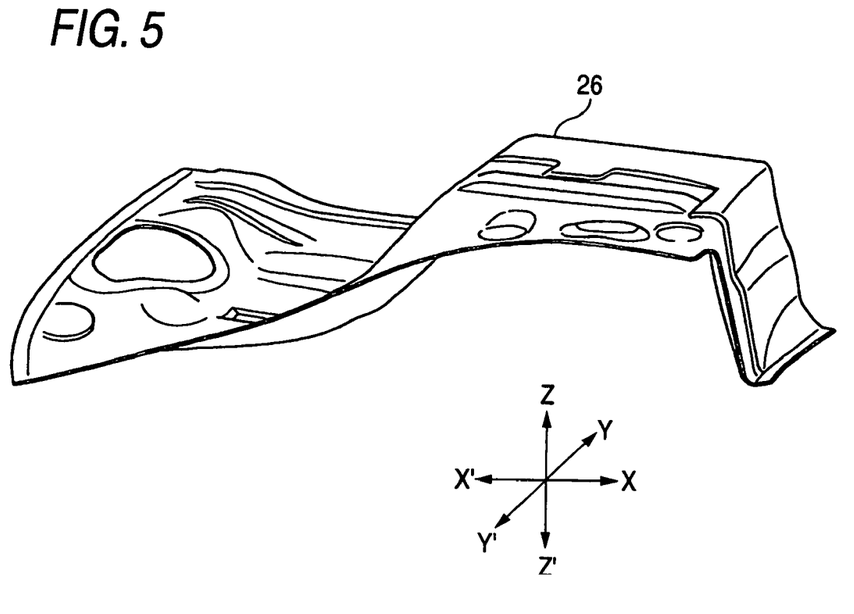
FIG. 5 is a schematically perspective diagram illustrating a floor panel.
Figure 6:
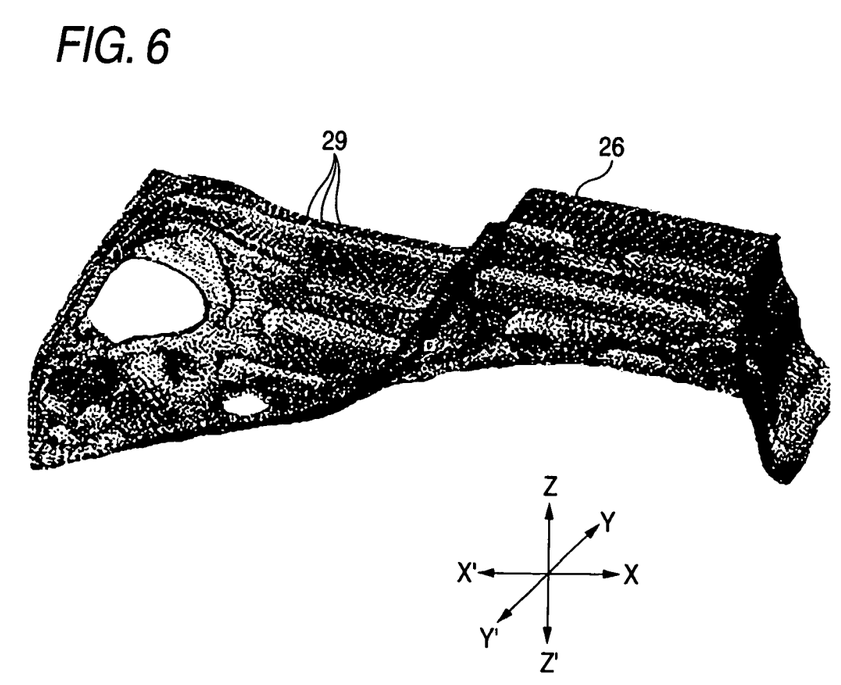
FIG. 6 is a diagram illustrating the floor panel divided into two-dimensional elements.

First, as illustrated in the flowchart shown in FIG. 4, the control portion 5 divides a surface of the floor panel 26 shown in FIG. 5 into a plurality of elements 29, as shown in FIG. 6. Thus, the control portion 5 constructs a two-dimensional numerical calculation model for numerical computation in step S1.

Subsequently, in step S2, the control portion 5 sets all of the elements 29 to be filled with air as an initial condition. Then, the control portion 5 specifies a direction of gravitational force in the numerical calculation model in step S3.

That is, a process performed in step S2 is a fluid setting process. A process performed in step S3 is an initial setting process. This condition indicates a condition, in which the periphery of the floor panel 26 is filled with air before the vehicle body 20 is put into the electrodeposition tank 22, in a simulated way. The above steps S1 to S3 correspond to the elements dividing program P1 (first step).

Then, in step S4, the control portion 5 sets an element 29, which is present at an end portion or a hole portion of the floor panel 26, as an initial boundary element. Subsequently, in step S5, a flanking element to be compared with the boundary element is set. Incidentally, the initial boundary element is an element at an end portion or a hole portion of the floor panel 26 and is set to be filled with the electrodeposition liquid. The flanking element is an element having a nodal point with the initial boundary element or with the secondary boundary element and is compared with neither the initial boundary element nor the secondary boundary element yet. The nodal point is a point formed by bringing vertices of elements in contact with one another. The above steps S4 and S5 correspond to the first boundary setting program P2 (second step).

Subsequently, in step S6, the height in the Z-direction of a point of center of gravity of the initial boundary element is compared with that in the Z-direction of a point of center of gravity of the flanking element. Then, it is determined that the electrodeposition liquid 23 is forced into the flanking element, the point of center of gravity of which is lower than that of center of gravity of the initial boundary element, against air 24, and that the flanking element, the point of center of gravity of which is lower than that of center of gravity of the initial boundary element, is filled with the electrodeposition liquid. Conversely, it is determined in step S7 that the air 24 remains in the element, the point of center of gravity of which is higher than that of center of gravity of the initial boundary element. This determination is based on the fact that the specific gravity of the electrodeposition liquid is larger than that of air. The above steps S6 and S7 correspond to the first analysis program P3 (third step).

Figure 7A:
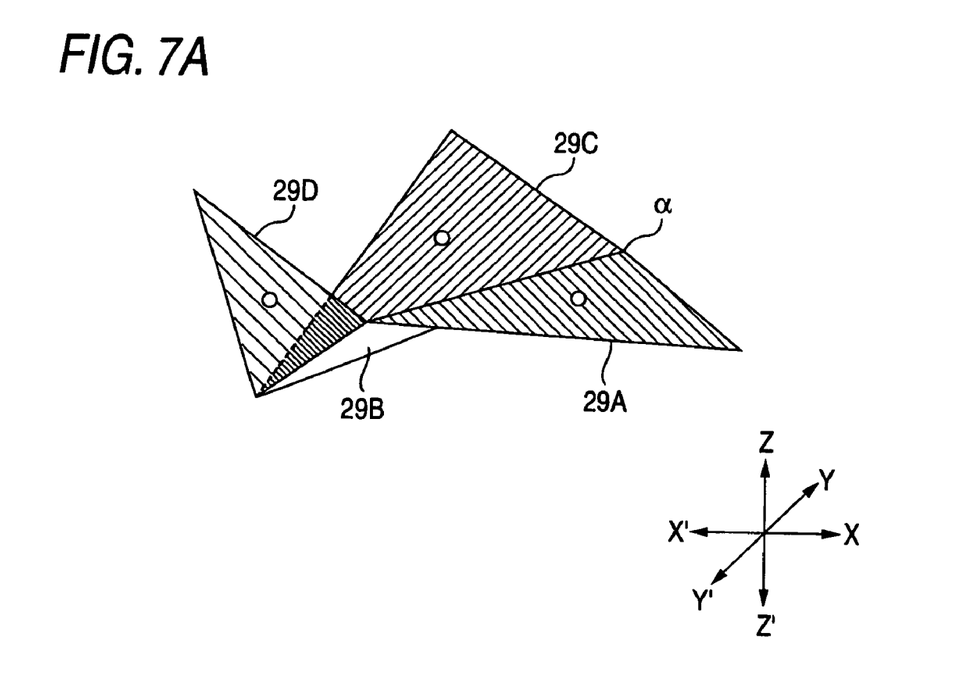
FIG. 7A is a diagram illustrating a part of the two-dimensional elements extracted from the floor panel.
Figure 7B:
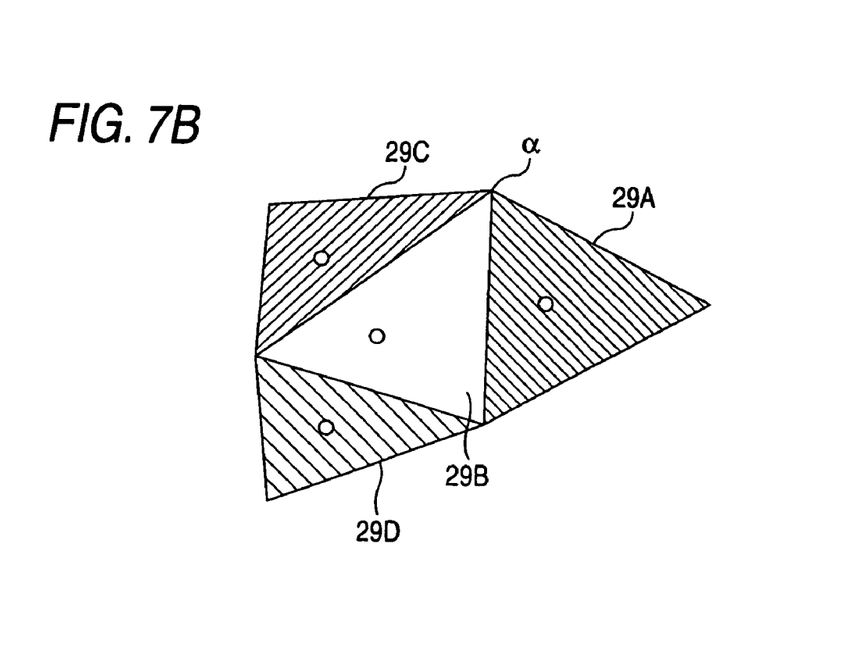
FIG. 7B is a top view of the elements shown in FIG. 7A.

This is more specifically described below. In a case where an element 29C shown in FIGS. 7A and 7B is set to be the initial boundary element, and where an element 29A having a nodal point α in common with the initial boundary element is set to be a flanking element, the height in the Z-direction of the point of center of gravity of the initial boundary element 29C is compared with that in the Z-direction of the point of center of gravity of the flanking element 29A. In a case where the point of center of gravity of the flanking element 29A is lower than that of center of gravity of the initial boundary element 29C, it is determined that the flanking element 29A is filled with the electrodeposition liquid. Conversely, in a case where the point of center of gravity of the flanking element 29A is higher than that of center of gravity of the initial boundary element 29C, it is determined that the flanking element 29A is filled with air. This comparison method is similar to a comparison method performed in a case where the secondary boundary element, which will be described later, is compared with the flanking element.

Subsequently, in step S8, the flanking element, which has already been compared with the initial boundary element, is set to be a secondary boundary element. Then, it is determined in step S9 whether there is any flanking element adjoining the, newly set secondary boundary element. Incidentally, the secondary boundary element is an element that has already been compared with the initial boundary element or another secondary boundary element. The above step S8 corresponds to the secondary boundary setting program P4 (fourth step).

If it is determined that there is no flanking element (NO in step S9), the analysis is finished. Conversely, if it is determined that there is a flanking element (YES in step S9), the analysis of the flanking element is performed in step S10 by comparing the height of the point of center of gravity of the secondary boundary element with that of the point of center of gravity of the flanking element. If the height of the point of center of gravity of the flanking element is lower than that of the point of center of gravity of the secondary boundary element to be compared, it is determined in step S11 that the flanking element is filled with the electrodeposition liquid 23. If the height of the point of center of gravity of the flanking element is higher than that of the point of center of gravity of the secondary boundary element to be compared, it is determined in step S11 that the flanking element is filled with the air 24. In step S12, the flanking element, the analysis of which is finished, is set to be a secondary boundary element. The above steps S9 to S12 correspond to the second analysis program P5 (fifth step).

Subsequently, in step S13, it is determined whether there is any flanking element adjoining the newly set secondary boundary element. If it is determined that there is a flanking element (YES in step S13), the analysis of the flanking element is performed by comparing the height of the point of center of gravity of the secondary boundary element with that of the point of center of gravity of the flanking element in step S10. If it is determined that there is no flanking element (NO in step S13), the analysis is finished. The step S13 corresponds to the determination program P6 (sixth step).

Incidentally, in a case where there are plural initial or secondary boundary elements corresponding to a flanking element, the flanking element is compared with all the initial boundary elements (or the secondary boundary elements). If it is determined that the height of the point of center of gravity of the flanking element is lower than one of the initial boundary elements or the secondary boundary elements which are filled with the electrodeposition liquid, this flanking element is determined to be filled with the electrodeposition liquid.

As described above, according to the first exemplary embodiment of the invention, the analysis is performed by dividing the floor panel 26 into two-dimensional elements. Thus, as compared with the case of dividing the floor panel 26 into three-dimensional elements, a computation time from an initial state to a converged state can significantly be reduced. Consequently, even when the prototype car is not actually immersed in the coating material tank, the position of an air pocket can quickly be simulated by numerical calculation.

Also, the heights of the points of center of gravity of the two-dimensional elements having a nodal point in common are compared with each other. Thus, the analysis of the flanking element can quickly be performed. Also, it can accurately and easily be determined whether an air pocket occurs in an object to be coated.

Additionally, an element having a "nodal point" in common with the initial boundary element or the secondary boundary element is set to be a flanking element. Thus, the number of elements to be compared is increased, as compared with the case of setting an element having a "side" in common with the initial boundary element or the secondary boundary element. Consequently, determination can more accurately be performed.

Second Exemplary Embodiment

Next, a second exemplary embodiment of the invention is described below. Incidentally, the following description of the second exemplary embodiment is focused on differences from the aforementioned first exemplary embodiment of the invention. Additionally, in the second exemplary embodiment, the definitions of the initial boundary element, the secondary boundary element, and the flanking element are similar to those of such elements of the first exemplary embodiment.

Hereinafter, a method of simulating an occurrence of an air pocket in an object to be coated according to the second exemplary embodiment is described in detail with reference to a flowchart illustrated in FIG. 8. Incidentally, even in the second exemplary embodiment, the finite element method is used. Further, analysis is performed on a floor panel 26 shown in FIG. 5, among members of the vehicle body 20, by way of example.

Figure 8:
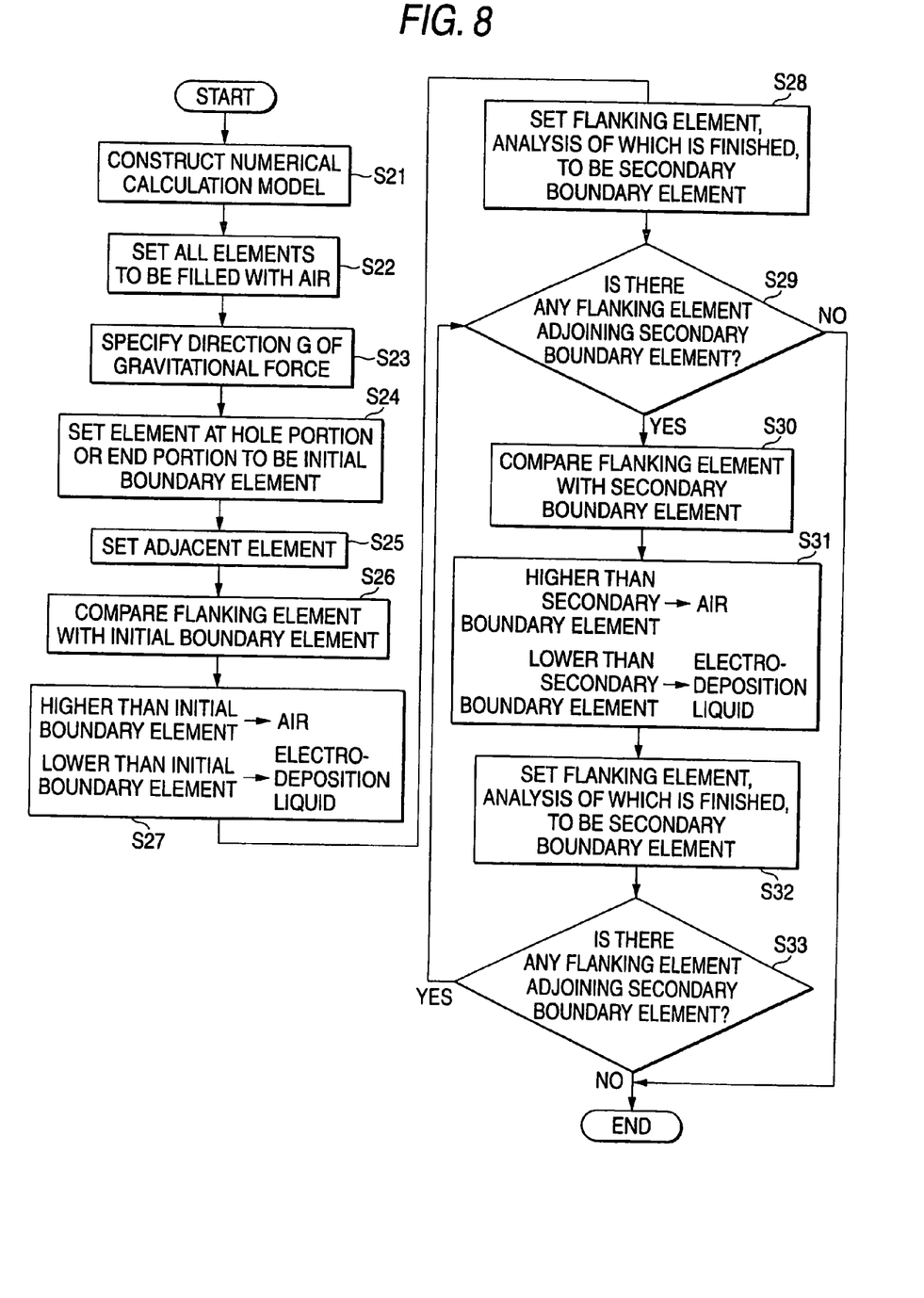
FIG. 8 is a flowchart illustrating a method of simulating an occurrence of an air pocket in a coating object according to a second exemplary embodiment.

First, as illustrated in the flowchart shown in FIG. 8, the control portion 5 divides a surface of the floor panel 26 shown in FIG. 5 into a plurality of elements 29, as shown in FIG. 6, to thereby construct a two-dimensional numerical calculation model for numerical computation in step S21.

Subsequently, in step S22, the control portion 5 sets all of the elements 29 to be filled with air as an initial condition. Then, the control portion 5 specifies a direction of gravitational force in the numerical calculation model in step S23.

That is, a process performed in step S22 is a fluid setting process. A process performed in step S23 is an initial setting process. This condition indicates a condition, in which the periphery of the floor panel 26 is filled with air before the vehicle body 20 is put into the electrodeposition tank 22, in a simulated way.

Then, in step S24, the control portion 5 sets an element 29, which is present at an end portion or a hole portion of the floor panel 26, as an initial boundary element. Subsequently, in step S25, a flanking element to be compared with the boundary element is set. In step S26, the height in the Z-direction of the highest nodal point of the initial boundary element is compared with that in the Z-direction of the highest nodal point of the flanking element. Then, it is determined that the electrodeposition liquid 23 is forced into the flanking element, the highest nodal point of which is lower than that of the initial boundary element, against air 24, and that the flanking element, the highest nodal point of which is lower than that of the initial boundary element, is filled with the electrodeposition liquid 23. Conversely, it is determined in step S27 that the air 24 remains in the element, the highest nodal point of which is higher than that of the initial boundary element. Incidentally, the highest nodal point of an element is a nodal point having a largest height in the Z-direction, among nodal points of this element.

Figure 9A:
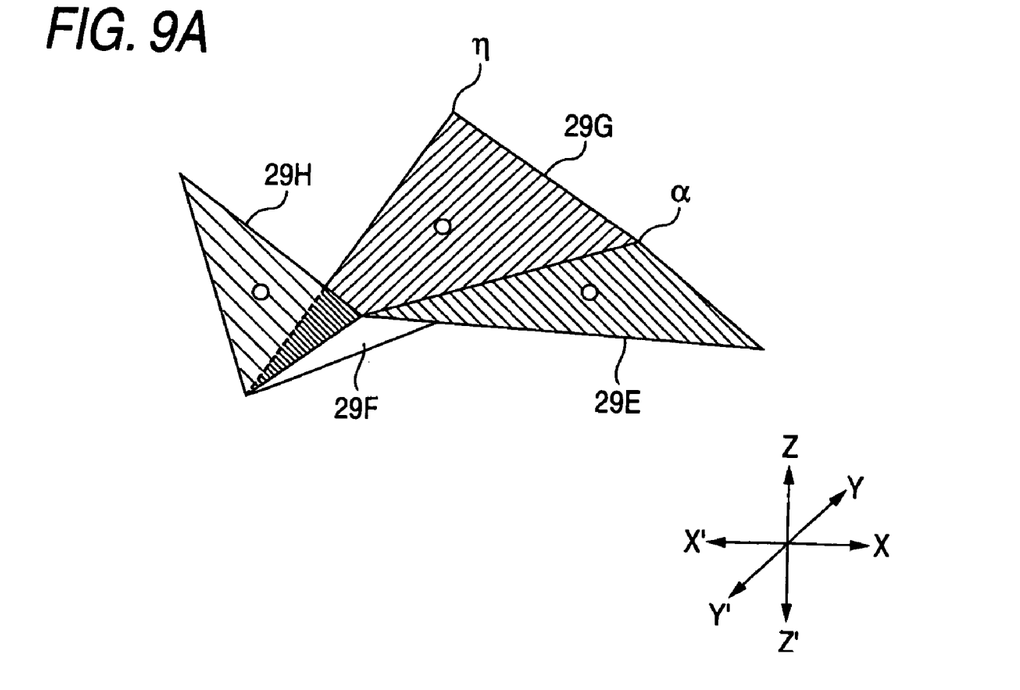
FIG. 9A is a diagram illustrating a part of two-dimensional elements extracted from the floor panel.
Figure 9B:
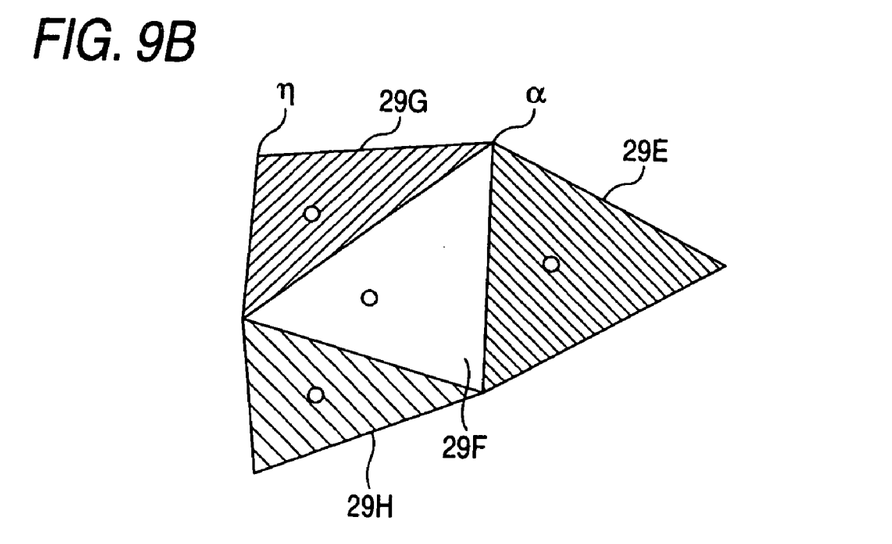
FIG. 9B is a top view of the elements shown in FIG. 9A.

This is more specifically described below. In a case where an element 29G shown in FIGS. 9A and 9B is set to be the initial boundary element, and where an element 29E having a nodal point α in common with the initial boundary element is set to be a flanking element, the height in the Z-direction of the highest nodal point η of the initial boundary element 29G is compared with that in the Z-direction of the highest nodal point α of the flanking element 29E. In a case where the highest nodal point α is lower than the highest nodal point η, it is determined that the flanking element 29E is filled with the electrodeposition liquid. Conversely, in a case where the height in the Z-direction of the highest nodal point η of the initial boundary element 29G is compared with that in the Z-direction of the highest nodal point α of the flanking element 29E, and where the highest nodal point α is higher than the highest nodal point η, it is determined that the flanking element 29E is filled with air. This comparison method is similar to a comparison method performed in a case where the secondary boundary element, which will be described later, is compared with the flanking element.

Subsequently, in step S28, the flanking element, which has already been compared with the initial boundary element, is set to be a secondary boundary element. Then, it is determined in step S29 whether there is any flanking element adjoining this secondary boundary element. If it is determined that there is no flanking element (NO in step S29), the analysis is finished. Conversely, if it is determined that there is a flanking element (YES in step S29), the analysis of the flanking element is performed in step S30 by comparing the height of the highest nodal point of the secondary boundary element with that of the highest nodal point of the flanking element. If the highest nodal point of the flanking element is lower than that of the highest nodal point of the secondary boundary element to be compared, it is determined in step S31 that the flanking element is filled with the electrodeposition liquid. If the highest nodal point of the flanking element is higher than that of the highest nodal point of the secondary boundary element to be compared, it is determined in step S31 that the flanking element is filled with air. In step S32, the flanking element, the analysis of which is finished, is set to be a secondary boundary element.

Subsequently, in step S33, it is determined whether there is any flanking element adjoining the newly set secondary boundary element. If it is determined that there is a flanking element (YES in step S33), the analysis of the flanking element is performed by comparing the height of the highest nodal point of the secondary boundary element with that of the highest nodal point of the flanking element in step S30. If it is determined that there is no flanking element (NO in step S33), the analysis is finished.

Incidentally, even in the second exemplary embodiment, in a case where there are plural initial or secondary boundary elements corresponding to a flanking element, the flanking element is compared with all the initial boundary elements (or the secondary boundary elements). If it is determined that the highest nodal point of the flanking element is lower than that of one of the initial boundary elements or the secondary boundary elements which are filled with the electrodeposition liquid, this flanking element is determined to be filled with the electrodeposition liquid.

As described above, according to the second exemplary embodiment of the invention, the analysis is performed by dividing the floor panel into two-dimensional elements, similarly to the first exemplary embodiment. Thus, as compared with the case of dividing the floor panel into three-dimensional elements, a computation time from an initial state to a converged state can significantly be reduced. Consequently, even when the prototype car is not actually immersed in the coating material tank 22, the position of an air pocket can quickly be simulated by numerical calculation.

Also, the analysis of the flanking elements can quickly be achieved by comparing the height of the highest nodal points of two-dimensional elements having nodal points in common with each other. Also, it can accurately and easily be determined whether an air pocket occurs in an object to be coated.

Incidentally, the first to fourth methods of the invention can be applied not only to the electrodeposition coating of a vehicle body but to cleaning of a plating process tank.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of simulating an occurrence of an air pocket in an object to be coated, the method comprising:
    dividing a shape data of the object, which is to be immersed in a coating material tank, into a plurality of two-dimensional elements;
    setting an element disposed at an end portion of the object or a hole portion of the object as an initial boundary element, and setting an element comprising a common nodal point with the initial boundary element as a flanking element;
    analyzing the flanking element, set from the element comprising the common nodal point with the initial boundary element, based on the initial boundary element;
    setting the analyzed flanking element, set from the element comprising the common nodal point with the initial boundary element, as a secondary boundary element, and also setting an element comprising a common nodal point with the secondary boundary element as a flanking element;
    analyzing the flanking element, set from the element comprising the common nodal point with the secondary boundary element, based on the secondary boundary element;
    determining whether there is a flanking element adjoining the secondary boundary element;
    repeatedly performing, using a computer, when it is determined that there is a flanking element adjoining the secondary boundary element, analyzing the flanking element adjoining the secondary boundary element based on the secondary boundary element, and setting the analyzed flanking element which adjoined the secondary boundary element as the secondary boundary element and setting an element with a common nodal point with the secondary boundary element as a flanking element until it is determined that there is no flanking element adjoining the secondary boundary element; and
    finishing analysis when it is determined that there is no flanking element adjoining the secondary boundary element,
    wherein analyzing the flanking element comprises comparing a height characteristic of the flanking element with a height characteristic of one of the secondary boundary element and the initial boundary element to determine if the flanking element is filled with an air or a liquid coating material.

2. The method according to claim 1, wherein a height of a center of gravity of the flanking element, set from the element comprising the common nodal point with the initial boundary element, is compared with a height of a center of gravity of the initial boundary element,
    wherein, if the height of the center of gravity of the initial boundary element is greater than the height of the center of gravity of the flanking element, set from the element comprising the common nodal point with the initial boundary element, then it is determined that the flanking element, set from the element comprising the common nodal point with the initial boundary element, is filled with liquid coating material,
    wherein, if the height of the center of gravity of the initial boundary element is less than the height of the center of gravity of the flanking element, set from the element comprising the common nodal point with the initial boundary element, then it is determined that the flanking element, set from the element comprising the common nodal point with the initial boundary element, is filled with air, wherein a height of a center of gravity of the flanking element, set from the element comprising the common nodal point with the secondary boundary element, is compared with a height of a center of gravity of the secondary boundary element, wherein, if the height of the center of gravity of the secondary boundary element is greater than the height of the center of gravity of the flanking element, set from the element comprising the common nodal point with the secondary boundary element, then it is determined that the flanking element, set from the element comprising the common nodal point with the secondary boundary element, is filled with liquid coating material, and wherein, if the height of the center of gravity of the secondary boundary element is less than the height of the center of gravity of the flanking element, set from the element comprising the common nodal point with the secondary boundary element, then it is determined that the flanking element, set from the element comprising the common nodal point with the secondary boundary element, is filled with air.

3. The method according to claim 2, wherein the liquid coating material comprises a liquid disposed in the coating material tank.

4. The method according to claim 1, wherein a height of a highest nodal point of the flanking element, set from the element comprising the common nodal point with the initial boundary element, is compared with a height of a highest nodal point of the initial boundary element, wherein, if the height of the highest nodal point of the initial boundary element is greater than the height of the highest nodal point of the flanking element, set from the element comprising the common nodal point with the initial boundary element, then it is determined that the flanking element, set from the element comprising the common nodal point with the initial boundary element, is filled with liquid coating material, wherein, if the height of the highest nodal point of the initial boundary element is less than the height of the highest nodal point of the flanking element, set from the element comprising the common nodal point with the initial boundary element, then it is determined that the flanking element, set from the element comprising the common nodal point with the initial boundary element, is filled with air, wherein, a height of a highest nodal point of the flanking element, set from the element comprising the common nodal point with the secondary boundary element, is compared with a height of a highest nodal point of the secondary boundary element, wherein, if the height of the highest nodal point of the secondary boundary element is greater than the height of the highest nodal point of the flanking element, set from the element comprising the common nodal point with the secondary boundary element, then it is determined that the flanking element, set from the element comprising the common nodal point with the secondary boundary element, is filled with liquid coating material, and wherein, if the height of the highest nodal point of the secondary boundary element is less than the height of the highest nodal point of the flanking element, set from the element comprising the common nodal point with the secondary boundary element, then it is determined that the flanking element, set from the element comprising the common nodal point with the secondary boundary element, is filled with air.

5. The method according to claim 1, wherein the object comprises a vehicle body.

6. The method according to claim 1, further comprising:
   upon finishing analysis, identifying elements determined to be filled with air as containing an air pocket.

7. The method according to claim 1, wherein the initial boundary element, the flanking element, and the secondary boundary element comprise two-dimensional elements.

8. The method according to claim 1, wherein an entirety of the elements analyzed comprise two dimensional elements.

9. The method according to claim 1, further comprising:
   initially setting all of the plurality of two-dimensional elements as being filled with air.

10. The method according to claim 1, wherein the initial boundary element comprises a plurality of initial boundary elements.

11. A programmable storage medium tangibly embodying a program of machine-readable instructions executable by a digital processing apparatus to perform a method of simulating an occurrence of an air pocket in an object to be coated, said method comprising:
   dividing a shape data of the object, which is to be immersed in a coating material tank, into a plurality of two-dimensional elements;
   setting an element disposed at an end portion of the object or a hole portion of the object as an initial boundary element, and setting an element comprising a common nodal point with the initial boundary element as a flanking element;
   analyzing the flanking element, set from the element comprising the common nodal point with the initial boundary element, based on the initial boundary element;
   setting the analyzed flanking element, set from the element comprising the common nodal point with the initial boundary element, as a secondary boundary element, and also setting an element comprising a common nodal point with the secondary boundary element as a flanking element;
   analyzing the flanking element, set from the element comprising the common nodal point with the secondary boundary element, based on the secondary boundary element;
   determining whether there is any flanking element adjoining the secondary boundary element;
   repeatedly performing, when it is determined that there is a flanking element adjoining the secondary boundary element, the analyzing the flanking element adjoining the secondary boundary element based on the secondary boundary element, and setting the analyzed flanking element which adjoined the secondary boundary element as the secondary boundary element and setting an element with a common nodal point with the secondary boundary element as a flanking element until it is determined that there is no flanking element adjoining the secondary boundary element; and
   finishing analysis when it is determined that there is no flanking element adjoining the secondary boundary element,
   wherein analyzing the flanking element comprises comparing a height characteristic of the flanking element with a height characteristic of one of the secondary boundary element and the initial boundary element to determine if the flanking element is filled with an air or a liquid coating material.

12. The programmable storage medium according to claim 11, wherein a height of a center of gravity of the flanking element, set from the element comprising the common nodal point with the initial boundary element, is compared with a height of a center of gravity of the initial boundary element,
wherein, if the height of the center of gravity of the initial boundary element is greater than the height of the center of gravity of the flanking element, set from the element comprising the common nodal point with the initial boundary element, then it is determined that the flanking element, set from the element comprising the common nodal point with the initial boundary element, is filled with liquid coating material,
wherein, if the height of the center of gravity of the initial boundary element is less than the height of the center of gravity of the flanking element, set from the element comprising the common nodal point with the initial boundary element, then it is determined that the flanking element, set from the element comprising the common nodal point with the initial boundary element, is filled with air,
wherein a height of a center of gravity of the flanking element, set from the element comprising the common nodal point with the secondary boundary element, is compared with a height of a center of gravity of the secondary boundary element,
wherein, if the height of the center of gravity of the secondary boundary element is greater than the height of the center of gravity of the flanking element, set from the element comprising the common nodal point with the secondary boundary element, then it is determined that the flanking element, set from the element comprising the common nodal point with the secondary boundary element, is filled with liquid coating material, and
wherein, if the height of the center of gravity of the secondary boundary element is less than the height of the center of gravity of the flanking element, set from the element comprising the common nodal point with the secondary boundary element, then it is determined that the flanking element, set from the element comprising the common nodal point with the secondary boundary element, is filled with air.

13. The programmable storage medium according to claim 11, wherein a height of a highest nodal point of the flanking element, set from the element comprising the common nodal point with the initial boundary element, is compared with a height of a highest nodal point of the initial boundary element,
wherein, if the height of the highest nodal point of the initial boundary element is greater than the highest nodal point of the flanking element, set from the element comprising the common nodal point with the initial boundary element, then it is determined that the flanking element is filled with liquid coating material,
wherein, if the height of the highest nodal point of the initial boundary element is less than the highest nodal point of the flanking element, set from the element comprising the common nodal point with the initial boundary element, then it is determined that the flanking element is filled with air,
wherein a height of a highest nodal point of the flanking element, set from the element comprising the common nodal point with the secondary boundary element, is compared with a height of a highest nodal point of the secondary boundary element,
wherein, if the height of the highest nodal point of the secondary boundary element is greater than the height of the highest nodal point of the flanking element, set from the element comprising the common nodal point with the secondary boundary element, then it is determined that the flanking element, set from the element comprising the common nodal point with the secondary boundary element, is filled with liquid coating material, and
wherein, if the height of the highest nodal point of the secondary boundary element is less than the height of the highest nodal point of the flanking element, set from the element comprising the common nodal point with the secondary boundary element, then it is determined that the flanking element is filled with air.

14. The programmable storage medium according to claim 11, wherein the object comprises a vehicle body.

15. The programmable storage medium according to claim 11, wherein said dividing shape data comprises using a finite element method.

16. A programmable storage medium tangibly embodying a program of machine-readable instructions executable by a digital processing apparatus to perform a method of simulating an occurrence of an air pocket in an object to be coated, said method comprising:
dividing a shape data of the object into a plurality of two-dimensional elements;
setting an element of the object as an initial boundary element, and setting an element comprising a common nodal point with the initial boundary element as a flanking element;
analyzing the flanking element, set from the element comprising the common nodal point with the initial boundary element, based on the initial boundary element;
setting the analyzed flanking element, set from the element comprising a common nodal point with the initial boundary element, as a secondary boundary element, and also setting an element comprising a common nodal point with the secondary boundary element as a flanking element;
analyzing the flanking element, set from the element comprising the common nodal point with the secondary boundary element, based on the secondary boundary element;
determining whether there is any flanking element adjoining the secondary boundary element;
repeatedly performing, when it is determined that there is a flanking element adjoining the secondary boundary element, analyzing the flanking element adjoining the secondary boundary element based on the secondary boundary element, and setting the analyzed flanking element which adjoined the secondary boundary element as the secondary boundary element and setting an element with a common nodal point with the secondary boundary element as a flanking element until it is determined that there is no flanking element adjoining the secondary boundary element; and
finishing analysis when it is determined that there is no flanking element adjoining the secondary boundary element,
wherein analyzing the flanking element comprises comparing a height characteristic of the flanking element with a height characteristic of the one of the secondary boundary element or the initial boundary element to determine if the flanking element is filled with an air or a liquid coating material.

* * * * *